United States Patent [19]

De Graaf et al.

[11] Patent Number: 5,313,162
[45] Date of Patent: May 17, 1994

[54] APPARATUS FOR THROUGHFLOW NMR SPECTROSCOPY, ESPECIALLY FOR CELL SUSPENSIONS

[75] Inventors: Albert De Graaf, Heerlen, Netherlands; Ulrich Probst, Aachen, Fed. Rep. of Germany

[73] Assignee: Forschungszentrum Julich GmbH, Julich, Fed. Rep. of Germany

[21] Appl. No.: 874,339

[22] Filed: Apr. 24, 1992

[30] Foreign Application Priority Data

Apr. 27, 1991 [DE] Fed. Rep. of Germany ....... 4113864

[51] Int. Cl.$^5$ .......................................... G01R 33/20
[52] U.S. Cl. .................................. 324/307; 324/306; 324/318; 324/300
[58] Field of Search ............... 324/318, 306, 300, 321, 324/308; 128/653.2, 653.3, 653.4

[56] References Cited

U.S. PATENT DOCUMENTS

| | | | |
|---|---|---|---|
| 4,246,537 | 1/1981 | Laukien et al. | 324/321 |
| 4,775,836 | 10/1988 | Starewicz | 324/318 |
| 5,150,054 | 9/1992 | Dupree | 324/318 |

FOREIGN PATENT DOCUMENTS

| | | | |
|---|---|---|---|
| 2004973 | of 0000 | Fed. Rep. of Germany | G01N 27/78 |
| 2845961B2 | of 0000 | Fed. Rep. of Germany | G01N 27/78 |

OTHER PUBLICATIONS

K. D. Barrows et; "P Nuclear Magneticccc Resonance Studies of the . . . " J. Biol. Chem.25) (1984) pp. 5711–5716.
R. Ronzalez-Mendez et; "Continuous-Flow NMR Culture System for . . . " Bioche.Biophys.Acta 720 (1982) pp. 274–280.
H. Santos et al; "Characterization of the Improved Sensitivity . . . " J. of Magnetic Resonance 68 (1986) pp. 345–349.
J. J. Grimaldi et al; "Design of Stopped-Flow NMR Rapid-Mixing Cells" Rev.Sci.Instr. 46 (1975) pp. 1201–1205.
E. Bayer et al; "Continuous-Flow Carbon-13 Nuclear Magnetic . . . " J.Chromat.312('984) pp. 91–97.
J. C. Kertesz et al; Journal of Physics E: Scientific instruments, vol. (1973) "The operational characteristics of a stopped-flow system for . . . ".
H. Santos, D. L. Turner; Journal of Magnetic Resonance 68 (1986) "Characterization of the improved sensitivity obtained using a flow method . . . ".
E. Bayer, K. Albert; Journal of Chromatography, 312 (1984) "Continuous-flow carbon-13 nuclear magnetic resonance spectroscopy".

Primary Examiner—Michael J. Tokar
Assistant Examiner—Raymond Y. Mah
Attorney, Agent, or Firm—Herbert Dubno; Yuri Kateshov

[57] ABSTRACT

A combined fermenter and measuring tube for NMR throughflow spectroscopy on cell suspensions in which the measurement tube has a capacity of 3 to 20 ml in the measuring zone of the magnet and a fermenter is a premagnetization reservoir of greater cross section of a capacity of at least 100 ml in the repolarization range. A liquid circulator is provided to provide a throughflow rate of 5 to 250 ml/s in the measuring tube.

15 Claims, 5 Drawing Sheets

APPARATUS FOR THROUGHFLOW NMR SPECTROSCOPY, ESPECIALLY FOR CELL SUSPENSIONS

FIELD OF THE INVENTION

The present invention relates to an apparatus for carrying out throughflow nuclear magnetic resonance spectroscopy, especially upon cell suspensions. More particularly, the invention relates to an NMR spectroscopy apparatus which utilizes wide-bore cryogenic magnets (cryomagnets) with a vertical bore to accommodate measuring tubes which are closed at their bottoms, are configured to effect a direction reversal in the throughflowing suspension (from downward flow to an upward flow) and which are connected to premagnetization reservoirs and means for effecting the flow of the liquid medium to the device and withdrawal of the liquid medium from the device. According to the invention, the tube at which the measurement takes place can be substantially narrower than the premagnetization reservoir and can be referred to as a tubule.

BACKGROUND OF THE INVENTION

NMR spectroscopy has been found to be an important procedure in chemical analysis for many years. Since the end of the 1970s, it has been used to study living cells and tissues with increasing importance. It enables, inter alia, the measurement of metabolite concentrations, pH values and the kinematics of enzymatic reactions in intact cells and allows a researcher to follow metabolic processes.

A serious problem with the in vivo use of NMR spectroscopy for cell suspensions is that the method is relatively insensitive. For example, the measuring time required for a given signal/noise ratio (S/N) increases by a square law with decreasing cell density (number of cells per volume), i.e. the measuring time is in an inverse square relationship with the cell density. That means that a ten-fold reduction in the cell density requires a 100-fold greater measurement time. This, in turn, creates problems with respect to maintenance of the viable cell materials in an undamaged state in the measuring tubes over the lengthy measuring periods.

Upon research with cell suspensions, therefore, it has been desirable to concentrate them to the highest possible extent (for example, to 50% cell internal volume in terms of the total sample volume).

In K. D. Barrows et al (J. Biol. Chem. 259 (1984)-5711, 5716), for example, experiments are described in which the cell suspensions are concentrated to 34% internal cell volume. During the measurements, the organisms are retained in standard NMR tubes (10 mm diameter, 20 cm length) without concern for damage. In this manner, with a one-minute exposure time, spectra can be obtained at the important intracellular resonances with a signal/noise ratio (S/N) of about 5:1.

In order to maintain cells in such highly concentrated suspension for long periods of time in a stable state, attempts have been made to supply the cells in situ in the NMR measuring chamber. For this purpose, cylindrical so-called hollow-fiber reactors with a diameter of about 20 mm can be used. Here nutrients and waste products diffuse through the membrane walls of numerous hollow fibers traversed by the suspension (see R. Gonzalez-Mendez, et al, Biochim Biophys. Acta 720 (1982) 274–280). In such reactors, the cell can be retained for periods in excess of 40 days in a viable state. This state is not, however, constant either over the total time period nor over the entire reactor volume.

In H. Santos, et al (J. Magnetic Resonance 68 (1986) 345–349), a method of improving the sensitivity is described wherein the signal obtained by an effective reduced saturation of the NMR signal is obtained. In the experimental apparatus, a dense cellular suspension is continuously circulated with the aid of a air-lift system through the NMR measuring chamber which can be a standard NMR tubule with a diameter of 10 mm and a length of about 20 cm, containing a coaxial inner tubule. By comparison with standard conditions, the filling level of the 10 mm tubule is increased by a factor of 2 to 3. The portion of the NMR tube above the NMR measuring chamber is here used as a premagnetization chamber. The apparatus here described is used for in vivo $^{13}C$ NMR with continuous flowthrough operation with a residence time in the measuring chamber greater than 4 seconds (maximum flow rate 1 ml/min:maximum chamber volume about 2 ml).

The use of a premagnetization chamber or space is also described in J. J. Grimaldi et al (Rev. Sci. Instr. 46 (1975), 1201–1205, for investigations into the kinematics of chemical reactions. Here the premagnetization volume is provided with the same diameter and approximately the same volume as the measuring chamber. This system, however, is used only for stop-flow operation, for, example $^1H$ NMR.

E. Bayer et al (J. Chromat. 312 (1984) 91–97) describe the use of a premagnetization space or compartment which, however, is not described in detail. In the U-tube arrangement of this document, the measuring chamber has a greater cross section than the feed line. It is designed for $^{13}C$ NMR in continuous flowthrough operation with a residence time in the NMR measuring chamber greater than 3 seconds.

OBJECTS OF THE INVENTION

It is the principal object of the present invention to provide an improved apparatus for carrying out NMR and especially flowthrough NMR of cellular and tissue suspension, whereby enhanced sensitivity can be obtained.

Another object of the invention is to provide an improved apparatus for the purposes described which, however, is free from the drawbacks of earlier systems.

A more specific object of the invention is to increase the measurement sensitivity of throughflow nuclear magnetic resonance spectroscopy for use in bio applications so that, for example, $^{31}P$ NMR investigation on dilute cell suspensions (cell internal volumes less than or equal to 0.5% by volume with reference to the total sample volume) within significantly shorter times (fewer hours) with less cell damage than has hitherto been the case. It may be observed that for such analyses, there have been no processes developed heretofore.

It may be observed further that the use of dilute or low-cell density cell suspensions is of importance since only in such suspensions can the organisms be held for long periods in a well-defined reproducible state and normal cell conditions maintained so that the investigations are under such normal conditions.

SUMMARY OF THE INVENTION

These objects and others which will become apparent hereinafter are attained, in accordance with the invention, with a measuring tube or tubule which is provided erect in a wide-bore cryomagnet and which has a sample capacity of 3 to 20 ml in this NMR measurement range, and means for effecting a continuous liquid circulation between a premagnetization reservoir above the tube and within the bore, and so that the measuring tube A has a flowthrough rate in the measuring tube of 5 to 250 ml/s, the premagnetization reservoir above the tube and from which the liquid is circulated back to the tube, has a greater cross section than that of the tube and at least a capacity of 100 ml within a zone of the magnetic bore the magnetic field strength of which amounts to at least 50% of that which prevails in the NMR measuring chamber of the bore.

More specifically the apparatus of the invention comprises:

a wide-bore cryogenic magnet having a vertical bore formed with a large-diameter upper section and a small-diameter lower section, the lower section being formed with a measurement element defining a measuring region;

a measuring tube closed at a bottom thereof and received in the lower section of the vertical bore and having a volumetric capacity in the measuring region of 3 to 20 ml;

a premagnetization reservoir of a cross section greater than a cross section of the measuring tube and received in the upper section and communicating with the measuring tube at a lower end of the reservoir, the premagnetization reservoir having a volumetric capacity of at least 100 ml over a portion thereof extending upwardly from the lower end and over a zone of the bore in which a magnetic field strength of the magnet is at least 50% of a magnetic field strength in the measuring region; and means for continuously circulating a liquid carrying a cell suspension between the reservoir and the measuring tube.

In this arrangement, in the repolarization range of the magnet, there is a widened bore which accommodates the greater cross sectional area of the premagnetization reservoir whose volume corresponds to the relationship $B/A > T_1/T_2*$, where B here represents the volume of the premagnetization reservoir, A the volume of the tube in the NMR measurement region, $T_1$ the longitudinal relaxation time and $T_2*$ the effective transverse relaxation time of the detection nuclei in the determination system. The residence time in the premagnetization reservoir thus can be made as long as is necessary and matched to the liquid circulation between measurement tube and premagnetization reservoir so that the liquid displacement means effects a liquid replacement time in the measuring tube of two times $T_2*$ to four times $T_2*$.

The zone within the magnet bore in which the magnetic field strength is at least 50% of the magnetic field strength in the measurement chamber or compartment is referred to as the "repolarization range."

According to the invention very high throughflow rates in the measuring or detection region are provided to achieve a high signal to noise ratio taking into account line or peak widening involved with high flow rates—but without detrimental effect in the biological systems which intrinsically have relatively wide lines in the first place so that a reduction of the throughflow rate would not afford a significant advantage. Supplementally, such high throughflow rates would require a sufficient repolarization of the activated nuclear spins which is achieved with the highest possible residence time in the premagnetization range.

As a consequence, the invention provides for an optimum volume in the premagnetization range and an optimum relationship between the volumes in the premagnetization range and the measurement range, and an optimum of high flow rates.

Under the conditions described, therefore, the optimum volume of the premagnetization range is that which allows maintenance of the optimum production of cells in a fermenter and thus that which is most suitable for fermenter instrumentation, while nevertheless providing optimally short residence times in the measurement range and significantly improved results in throughflow NMR spectroscopy with dilute cell suspensions. The viable cells are not subjected to conditions which are detrimental and in spite of the high throughflow rates, line widening is not detrimental as in general because line widening is intrinsic to biological systems, thus, in accordance with the invention NMR spectroscopy of biological systems can be optimized.

The measurement tubes can be formed by concentric tubes in which the inner tube can be extended or elongated and connected with the suction or pressure side of the pump which can be provided above the premagnetization reservoir or incorporated in the liquid of the latter.

Alternatively, the measurement tube can be partitioned by a wall which does not extend fully toward the opposite end, into two compartments of which one is elongated to form a connection tube running to the suction or pressure side of the pump that can be provided in the premagnetization reservoir or above the latter.

The invention is particularly advantageous for investigations into microorganisms and cell materials in which the premagnetization reservoir is formed as a fermenter and provided with appropriate aeration measurement and control devices which may be composed of nonmagnetic materials to the extent these components lie within the repolarization range of the magnet.

It is especially advantageous to provide the fermenter with a gasification/venting tube, pH electrode, a heating/cooling element to control the temperature of the fermenter, a temperature-measuring sensor; an outer bypass for concentration controlling, a feed-metering device, a suction tube for establishing the level to which the fermenter is filled; an oxygen electrode and, in addition, auxiliary control means serving as aeration, measuring and control units of the fermenter.

In the bypass, a biomass concentrating operation can be carried out, for example, by cross flow filtration.

Advantageously, for $^{31}P$ measurements in vivo, volume ratios of the capacity of the premagnetization reservoir (in a zone of at least 50% of the magnetic field strength prevailing in the measuring chamber in the measuring range or greater), to the measuring tubule can be greater than or equal to 30 and especially in the range of 40 to 60.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
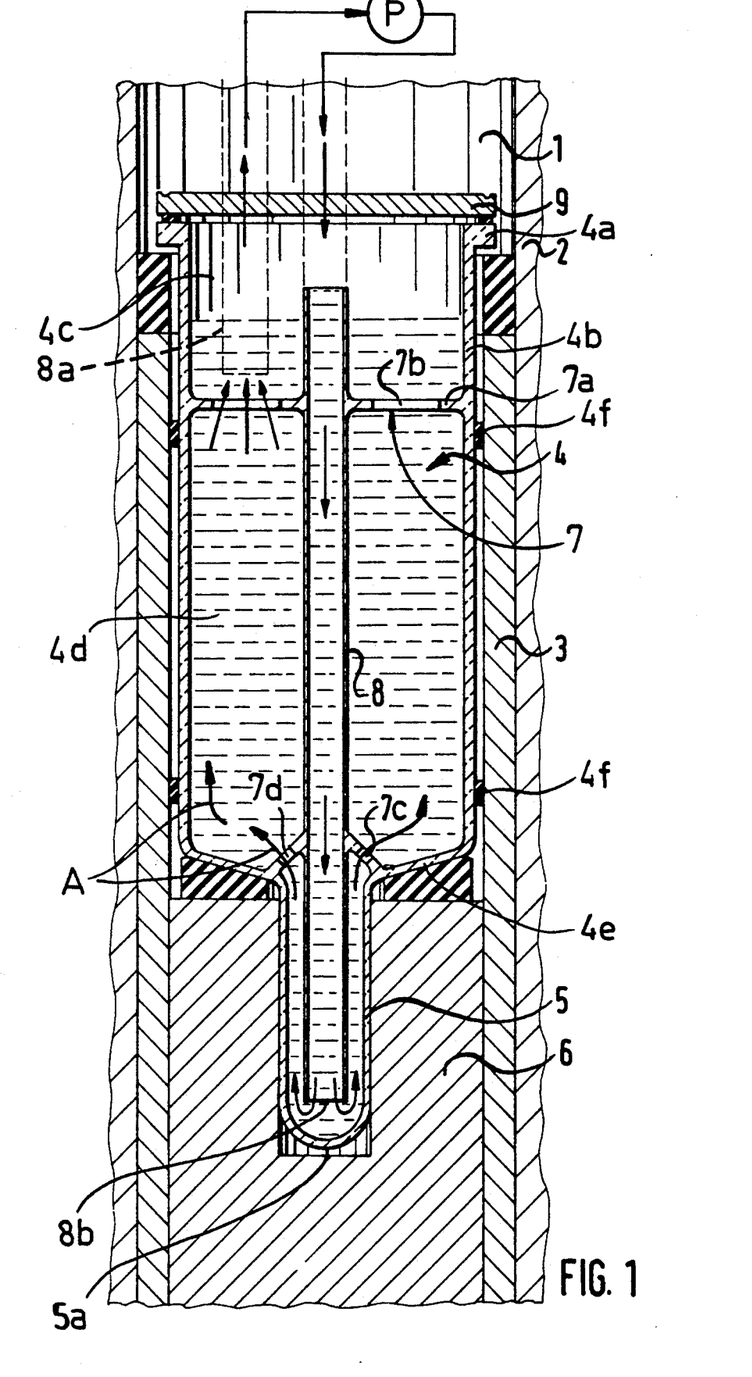
FIG. 1 is an apparatus showing, in axial cross section, and highly diagrammatically, a premagnetization reservoir and measuring tube in one mounting system, according to the invention.

In FIG. 1 we have shown a bore 1 defined by an inner wall of a magnet 2 and a coil unit 3 thereof containing inserted therein a premagnetization reservoir 4 to which an elongated measuring tube 5 is attached. The measuring tube 5 extends into an NMR measuring head 6 to provide a measuring chamber.

Inwardly extending glass braces 7 support an inner tube 8 which can extend through a cover 9 which closes off the premagnetization reservoir 4 and allows the latter to be used as a fermentation chamber or compartment. Approximately 10 cm above the fermentation cover is a pump represented at P which can be connected to the tube 5 and which feeds the suspension to the measuring tubule. The return from the reservoir 4 via the pump P utilizes a return tube 8a connected to the intake of the pump P.

In FIG. 1 we have not illustrated the measurement and control devices required for operation of the fermenter, these being conventional in the art with the exception that, in the region of magnetization, they are composed of nonmagnetizable materials.

The cover 9 can be seen to be seated upon an outwardly-extending flange 4a of the glass wall 4b of the reservoir 4, the upper support 7a for the tube 8, being a horizontal partition provided with angularly equispaced bores 7b permitting communication between the upper compartment 4c and the lower compartment 4d of the premagnetization reservoir 4. Alternatively, tube 8 may be supported by glass struts.

The lower supporting struts 7c of the premagnetization reservoir 4, together with the floor 4e thereof, form the bottom of this reservoir. The floor 4e is downwardly and inwardly extending and also frustoconical.

The tube 5 is cylindrical except for its closed bottom 5a. The inner tube 8 extends coaxially to the reservoir 4 and the measuring tube 5 to open at 8b close to the bottom 5a of the tube 5 and the support 7c has openings 7d (or is formed by struts) permitting the suspension to pass in the direction of the arrows A from the tube 5 into the reservoir 4.

Figure 2:
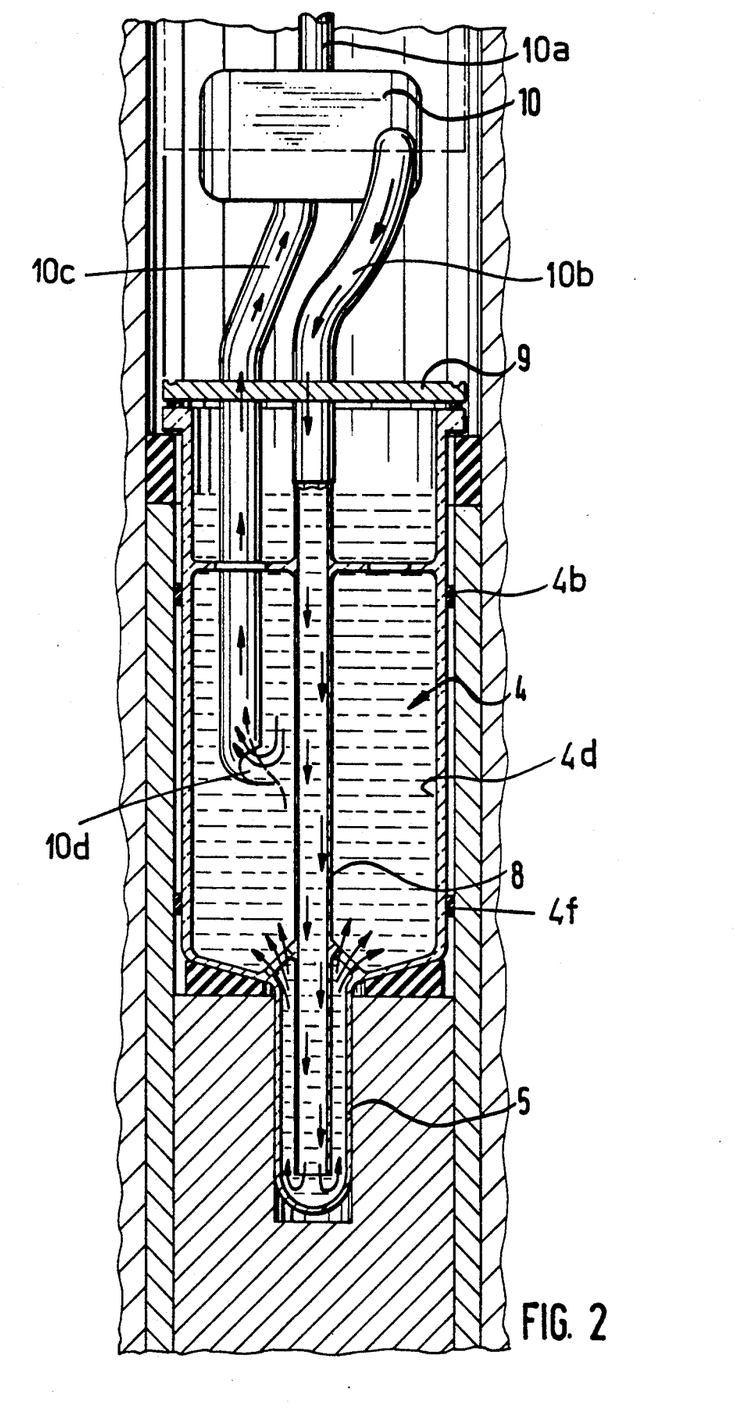
FIGS. 2-4 are views similar to FIG. 1 illustrating other embodiments with various locations of the pump.

In the embodiment of FIG. 2, we have shown the pump 10 in greater detail. That pump has a shaft 10a connected with an electric motor, an outlet tube 10b, e.g. a flexible tube, connected to the inner tube 8 and a flexible tube 10c having an intake 10d communicating with the compartment 4d of the reservoir. As in the embodiment of FIG. 1, the reservoir 4 is positioned within the coil 3 by elastomeric rings 4f.

Figure 3:
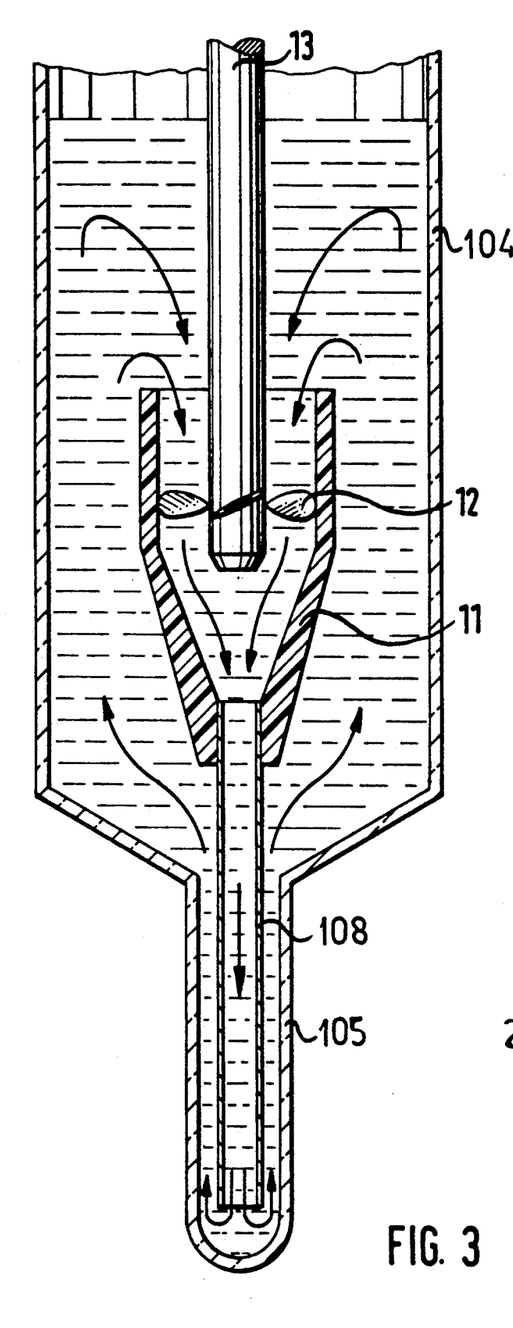

In the embodiment of FIG. 3, by contrast, the pump is formed by an impeller or rotor 12 on a drive shaft 13 and mounted in a conical enlargement 11 formed at the end of an inner tube 108 coaxial with the measuring tube 105, the latter being formed as a downward extension of the premagnetization reservoir 104.

This assembly is disposed within a magnetic assembly of the type shown in FIGS. 1 and 2 and equipped with a measuring head as previously described. Necessary mounting supports e.g. struts are not shown in FIG. 3.

The flow of the circulating liquid, which here takes place entirely within the fermenter 4 formed by the premagnetization reservoir, is represented by the arrows in this Figure.

Furthermore, it is noted that the parts 11, 12, 13, located within the magnetic field region are composed of nonmagnetic materials, for example, synthetic resins, glass or the like.

Figure 4:
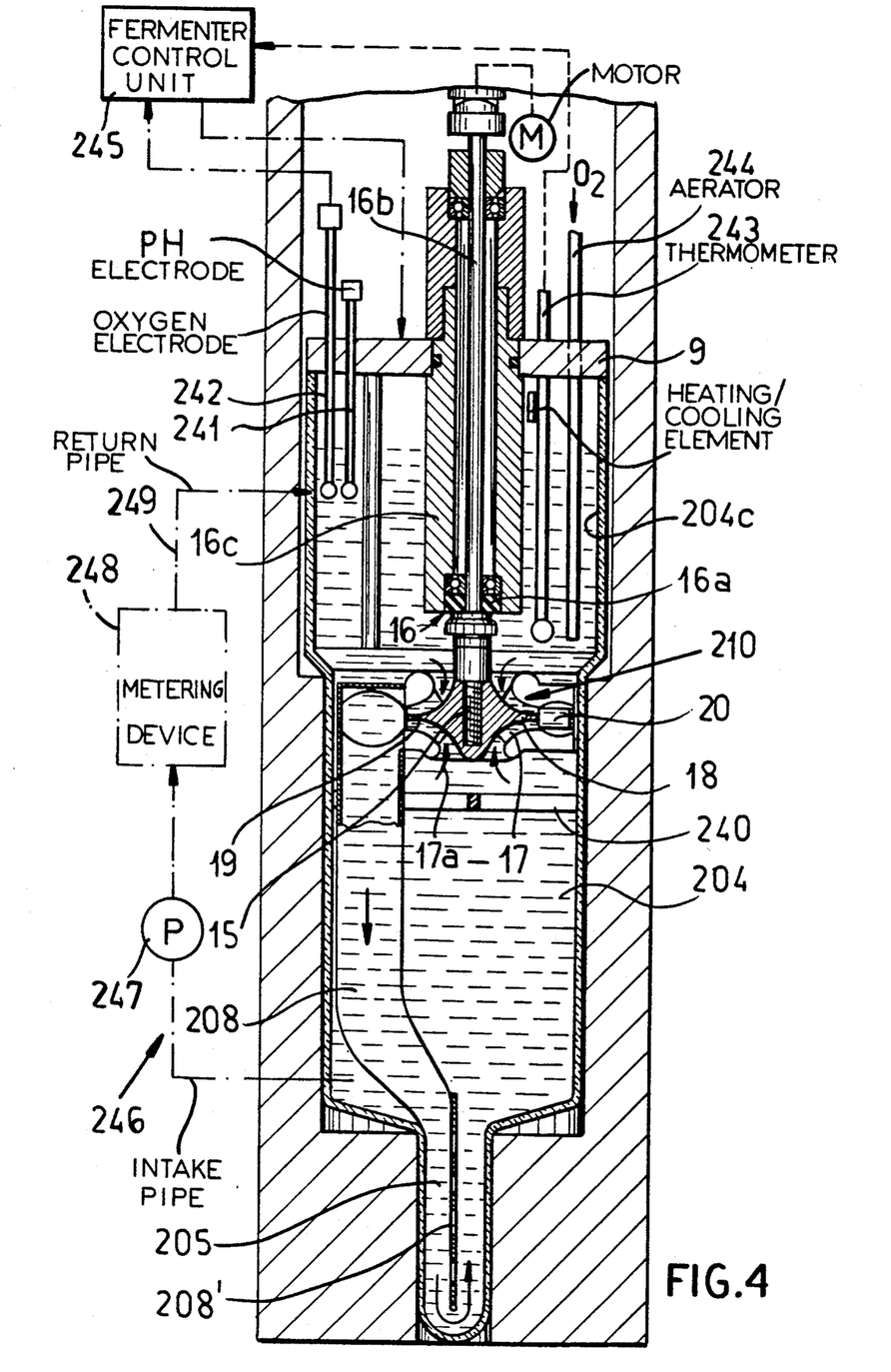

In FIG. 4, we have shown a system which has proved to be highly effective in practice. In this embodiment, the tube 208 which extends toward the bottom of the measuring tube 205, is off-center and, as shown in FIG. 4, has an end 208' which lies to one side of the tube 205. The tube 205 is formed as a downward extension on the glass reservoir 204 forming the fermenter and, in this embodiment, is provided with an upper compartment 204c of the fermentater.

The extension 208' is here formed by a partition 14 (FIG. 4a) which terminates just above the bottom 205a of the tube 205.

The pump 210 of this embodiment is also located within the reservoir 204 and comprises a radial pump 15 driven by a motor M, not shown, and located outside the premagnetization range. The pump 15 is a radial pump and is driven by the motor M via a shaft assembly represented at 16. The pump has a rotor 18 and intake 17a conducting to blades 17 with radial outlets 19 in a one-outlet or plural-outlet system and serves to circulate the liquid charged with gas within the reservoir 204 and through the tube 208 to the measuring tube 205. The pump 210 can have one outlet 19 communicating with the tube 208 and another outlet 20 communicating directly with the reservoir 204 to set up two distinct circulations. The region above the pump 210 has been found to serve successively to receive fermenter instrumentation.

The shaft assembly can include graphite bearings which allow speeds up to 6000 rpm, preferably within a 1000-3000 rpm range. For continuous drive of the system, plastic ball bearings may be used with speeds up to 4000 rpm. A maximum volumetric flow of 2000 l/h can thus be achieved.

Figure 4A:
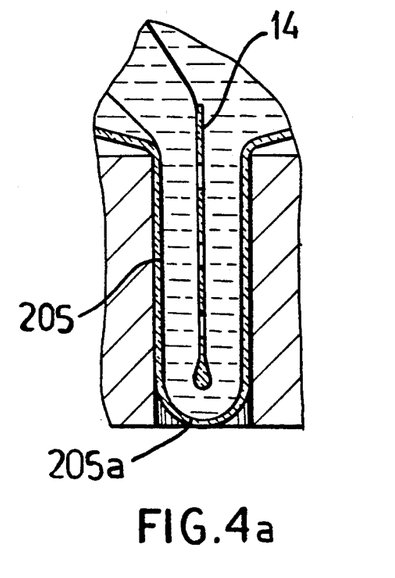
FIGS. 4a and 4b are diagrammatic cross sectional views illustrating various aspects of the measuring tube.
Figure 4B:
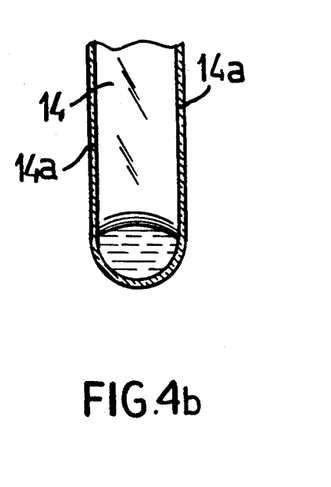

For the partitioning of the measuring tube 205 into two half cylinders which communicate at their bottoms within the measuring tube 205, a thin glass plate 14 may be used and can be cemented in place by a silicone adhesive as illustrated in FIGS. 4a and 4b. The adhesive can be provided in beads 14a along opposite edges of the glass plate 14. FIG. 4b should be understood to represent a section taken at a right angle to the plane of the section in FIG. 4a. The bottoms of the measuring tubes are preferably hemispherical so that a uniform deflection of the flow from the downward flow to the upward flow is effected, favored by a drop-like section of the bottom edge of plate 14, which edge could be advantageously (as shown in FIG. 4b) with a curved border.

By comparison to a coaxial arrangement of the inner tube with respect to the outer tube (compare FIGS. 4 and 2), the hydraulic cross section with the arrangement of FIGS. 4, 4a and 4b can provide a clear increase by about 14%, corresponding to a reduction in the flow resistance in this critical region of the measuring tube.

Above the measuring volume, the tube 8, 108, 208 can be connected to the measuring tube inlet by a silicone mass. In this manner a leak-free vibration damper and low stress transition is ensured.

The shaft assembly 16 can include a ring seal 16a between the shaft 16b and the housing 16c and can be located below the liquid level so that it is continuously wetted with water. The pump housing formed with the inlet 17 can be held together by three bolts (not shown). The rotor 18 can be an impeller provided in this housing and the axially in-drawn liquid can be forced into the outer passages 20 which can have the configuration of a logarithmic spiral and can return the liquid to the reservoir 204. It can also deliver the liquid to the tube 208.

To reduce the rotation of the contents of the fermenter, baffles, guide plates or the like in a star-shaped array and as represented at 240 in FIG. 4 can be provided at the intake of the pump. The baffles of this star-shaped array can be provided around the pump shaft 16b.

In addition, the fermenter can be provided with a pH electrode 241, an oxygen electrode 242, a temperature sensor including a thermometer 243, and an aerator 244, all as represented diagrammatically in FIG. 4 and forming part of the fermenter measurement and control unit generically indicated at 245. The latter may include all of the other elements required for fermenter control, for example, an electrode for measuring the redox potential, the cooling and heating rods 300, a venting system, a substrate feed system, a culture removal system, an additional stirrer or the like.

The bypass system has also been represented at 246 and can include a pump 247 for withdrawal of the fermenter contents, an evaporator 248 for concentrating the fermentation product and a return 249 for recycling the concentrate to the fermenter.

Figure 5:
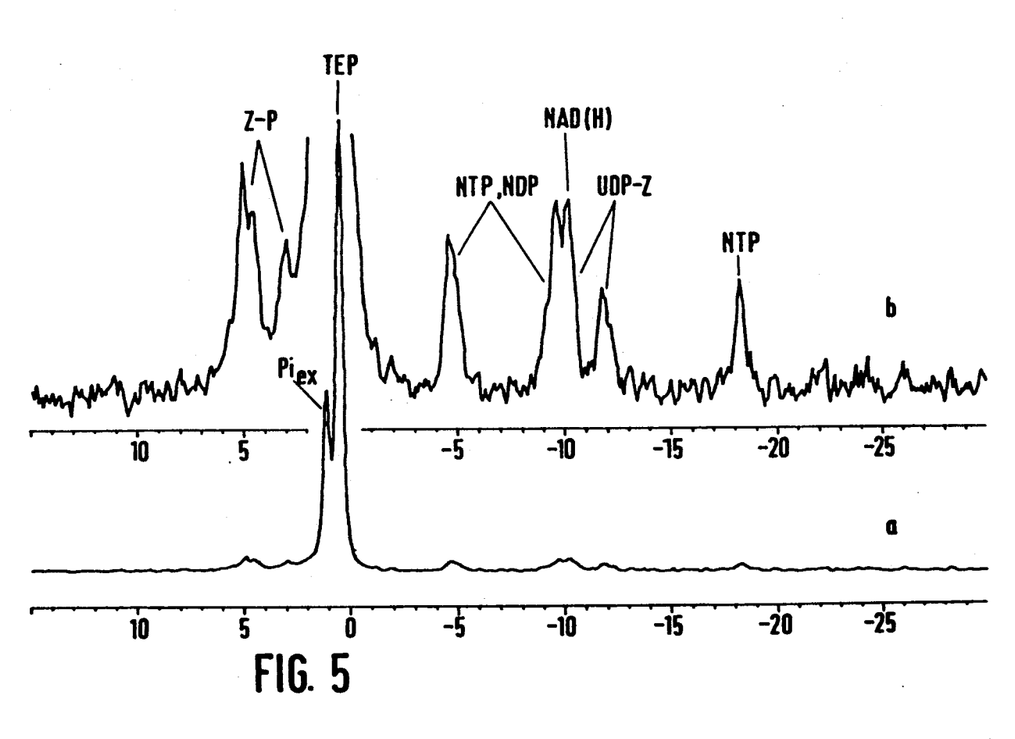
FIG. 5 is an NMR spectrum illustrating the invention.

FIG. 5 shows an NMR spectrum obtained with an apparatus of the type shown in FIG. 1 and includes at (a) an in vivo $^{31}$P-NMR spectrum of a suspension ($2.6 \cdot 10^9$ cells/ml) of Zymomonas mobilis in an NMR fermenter and at (b) the same spectrum with 17 fold signal amplification.

The optimum use of the throughflow nuclear magnetic resonance system shown in FIG. 4 (i.e. most intense energization with 90° pulses with minimal line widening) can be obtained under the following boundary conditions:

The residence time in the measuring chamber $T_m$ should be as low as possible, preferably greater than $3T_2^*$, however.

The residence time in the premagnetization chamber (fermenter) $T_v$ should be greater than $3T_1$ for 95% premagnetization.

From these conditions, the requisite premagnetization volume $V_v$ can be calculated when the measuring chamber volume $V_m$ is known:

$$V_v > V_m \cdot T_v / T_m.$$

For a typical use in in vivo $^{31}$P NMR ($T_2^* = 20$ ms, $T_1 = 1$s) requires $V_v$ to be greater than $50 V_m$. The residence time $T_m$ is then 60 ms which yields a line broadening of about 16 Hz.

In a practical realization of the arrangement of FIG. 1, the measuring chamber has a diameter of 20 mm.

For $^{31}$P in vivo use, practical parameters for $V_m = 9$ ml and $V_v$ greater than 450 ml. The prototype used to obtain the spectrum of FIG. 5 had only a total capacity of 375 ml with a level height of 19 cm and thus was not optimum. The diameter of the fermenter forming the volume $V_v$ was 7 cm.

In order to characterize the improved sensitivity, the NMR measurements were carried out on suspensions of the anaerobic bacterium Zymomonas mobilis using so-called batch fermentation after the introduction of glucose, the results of a Barrow measurement (measuring 1) being compared with a throughflow measurement with the system described (measurement 2).

The apparatus used was an AMX-400 WB NMR apparatus produced by the firm Bruker (Karlsruhe, Germany) with a 9.4 tesla magnet having a bore of 89 mm diameter.

Measurement 1: No throughflow operation, 10 mm NMR tube, $1.6 \cdot 10^{11}$ cells per ml, 1 minute exposure time.

Measurement 2: Throughflow operation, use of the fermenter device of the invention, $2.6 \cdot 10^9$ cells per ml, 30 minute exposure time, measuring tube 20 ml diameter.

The S/N value of the intercellular metabolite resonances in the spectra were identical, however the measurement of the invention did not require the extremely high cell density of the measurement according to the invention. Note that measurement 1 had a cell suspension that was greater by a factor of 60 in density than the measurement 2. With a cell density of $2.6 \cdot 10^9$ ml$^{-1}$, for the same S/N value, the measurement according to the conditions of measurement 1 would have required a measuring time of:

$$[(1.6 \cdot 10^{11})/(2.6 \cdot 10^9)]^2 = 3787 \text{ Min.}$$

The difference in measurement chamber diameter between measurements 1 and 2 results in a measurement time reduction with respect to the measurement 2 of the invention by a factor of 4. Calculating, therefore, the measurement time for shortening with the present invention (assuming identical cell density), one obtains a factor of $((3787)/30)/4 = 31.6$. This is equivalent to a 5.6 fold improved sensitivity.

FIG. 1 shows only the fermenter vessel. For its operation as a fermenter, a number of sensors or devices required for proper fermentation operation may be required, past the fermenter cover or otherwise. These include a pH electrode, an oxygen electrode, an electrode for measurement of the redox potential, a temperature sensor (e.g. Pt 100), cooling and heating rods, aerating tube, venting tube, substrate supply tube, culture removal tube, stirrer and, if desired, suction and feed tubes for the bypass.

External control equipment may include, as represented by the fermenter control tube 45 in FIG. 4, a pH control unit with pumps for the addition of acid or alkali solutions, the substrate metering system with pump, an oxygen concentration control unit, a temperature control unit with pump for cooling or heating medium circulation, a stirrer motor with variable speed, optionally an on-line cloud measurement system in the bypass line for the measurement and control of bio mass concentration and optionally crossflow filtration modules with filtrate removal in the bypass line for bio mass concentration.

We claim:

1. An apparatus for through-flow nuclear magnetic resonance spectroscopy, comprising:
   a wide-bore cryogenic magnet having a vertical bore formed with a large-diameter upper section and a small-diameter lower section, said lower section being formed with a measurement element defining a measuring region;
   a measuring tube formed with a closed bottom and received in said lower section of said vertical bore and having a volumetric capacity in said measuring region of 3 to 20 ml;

a premagnetization reservoir of a cross section greater than a cross section of said measuring tube and received in said upper section and communicating with said measuring tube at a lower end of said reservoir, said premagnetization reservoir having a volumetric capacity of at least 100 ml over a portion of said reservoir which extends upwardly from said lower end and over zone of the bore in which a magnetic field strength of said magnet is at least 50% of a magnetic field strength in said measuring region; and means for continuously circulating a liquid carrying a cell suspension between said reservoir and said measuring tube, providing a throughflow in the measuring tube of between 5 and 250 ml/s.

2. The apparatus defined in claim 1 wherein said means for continuously circulating includes a pump.

3. The apparatus defined in claim 2 wherein said measuring tube is formed by an inner tube coaxially received in an outer tube, one of said inner and outer tubes being connected to a discharge of said pump.

4. The apparatus defined in claim 3 wherein said inner tube is extended upwardly from said measuring tube and is connected with said pump.

5. The apparatus defined in claim 2 wherein said measuring tube is formed with a partition subdividing said measuring tube into two compartments, one of said compartments having an elongated duct connected with said pump.

6. The apparatus defined in claim 2 wherein said pump is located below a liquid level in said reservoir.

7. The apparatus defined in claim 6 wherein said pump is a radial pump in said reservoir.

8. The apparatus defined in claim 3 wherein said inner tube is extended upwardly into said reservoir and within said reservoir is formed with an upwardly open conical housing, said pump having an impeller rotatable in said housing for displacing said suspension therethrough, a motor being provided above said magnet and being operatively connected to said impeller.

9. The apparatus defined in claim 1 wherein said reservoir is formed as a fermenter and can receive aerating, measuring and control devices which, within a repolarization region of said magnet, are composed of nonmagnetizable materials.

10. The apparatus defined in claim 9 wherein each of said devices includes:

a gasification tube extending into said reservoir, a pH electrode mounted in said reservoir and having a free end extending below the surface of the liquid, a heating/cooling element for varying a temperature of the fermenter in said reservoir, a temperature-measuring sensor in said reservoir, an oxygen electrode in said reservoir, outer bypass system for concentrating said suspension including a device for metering said suspension into said reservoir and an intake pipe for setting a filling height of said fermenter, and a control unit operatively connected with said oxygen electrode sensor and the outer bypass system for controlling operation of the bypass system.

11. The apparatus defined in claim 2 wherein said pump is a centrifugal pump with a speed of 1000 to 3000 RPM.

12. The apparatus defined in claim 5 wherein said partition has a droplet-shaped bulge along its bottom edge.

13. The apparatus defined in claim 12 wherein said bottom edge is curved from end to end.

14. The apparatus defined in claim 13 wherein said bottom edge is downwardly concave.

15. The apparatus defined in claim 13 wherein said bottom edge is upwardly concave.

* * * * *